United States Patent
Ito et al.

(10) Patent No.: US 12,506,063 B2
(45) Date of Patent: Dec. 23, 2025

(54) SEMICONDUCTOR DEVICE INCLUDING SEMICONDUCTOR ELEMENTS, INSULATING BASE MEMBERS, WIRINGS, AND WIRING MEMBERS

(71) Applicant: SHINKO ELECTRIC INDUSTRIES CO., LTD., Nagano (JP)

(72) Inventors: Hitoshi Ito, Nagano (JP); Kenichi Koi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 525 days.

(21) Appl. No.: 17/984,502

(22) Filed: Nov. 10, 2022

(65) Prior Publication Data

US 2023/0145182 A1    May 11, 2023

(30) Foreign Application Priority Data

Nov. 11, 2021   (JP) ................................ 2021-183972

(51) Int. Cl.
*H01L 23/498*    (2006.01)
*H01L 21/48*     (2006.01)
(Continued)

(52) U.S. Cl.
CPC .... *H01L 23/49844* (2013.01); *H01L 21/4825* (2013.01); *H01L 21/4839* (2013.01);
(Continued)

(58) Field of Classification Search
CPC ......... H01L 23/49811; H01L 23/49833; H01L 23/4985; H01L 23/495; H01L 23/49537;
(Continued)

(56) References Cited

U.S. PATENT DOCUMENTS

| | | | |
|---|---|---|---|
| 8,686,569 B2 * | 4/2014 | Daeche | H01L 23/49524 257/676 |
| 2005/0224945 A1 * | 10/2005 | Saito | H01L 24/37 257/E23.052 |

(Continued)

FOREIGN PATENT DOCUMENTS

JP    2016-046523    4/2016

OTHER PUBLICATIONS

Extended European Search Report dated Apr. 5, 2023 issued in corresponding European application No. 22 20 6732; English text (10 pages).

*Primary Examiner* — Phat X Cao
(74) *Attorney, Agent, or Firm* — Rankin, Hill & Clark LLP

(57) ABSTRACT

A semiconductor device includes: a first semiconductor element; a second semiconductor element; a first insulating base member adhesively bonded to the first semiconductor element; a first wiring connected to a first electrode of the first semiconductor element, and disposed on the first insulating base member; a second insulating base member adhesively bonded to the second semiconductor element, a second wiring connected to a third electrode of the second semiconductor element, and disposed on the second insulating base member; a first wiring member connected to a second electrode of the first semiconductor element; a second wiring member electrically connected to the first wiring and a fourth electrode of the second semiconductor element; and a third wiring member connected to the second wiring. A current flows in a first direction in the first wiring member, and flows in a second direction opposite to the first direction in the third wiring member.

17 Claims, 10 Drawing Sheets

(51) Int. Cl.
*H01L 23/00* (2006.01)
*H01L 25/065* (2023.01)
*H01L 25/07* (2006.01)

(52) U.S. Cl.
CPC .. *H01L 23/49811* (2013.01); *H01L 23/49833* (2013.01); *H01L 23/4985* (2013.01); *H01L 24/32* (2013.01); *H01L 25/0657* (2013.01); *H01L 25/074* (2013.01); *H01L 2224/32058* (2013.01); *H01L 2224/32059* (2013.01); *H01L 2224/32225* (2013.01); *H01L 2224/32245* (2013.01); *H01L 2225/06524* (2013.01); *H01L 2225/06562* (2013.01); *H01L 2225/06572* (2013.01); *H01L 2924/30107* (2013.01)

(58) Field of Classification Search
CPC ........... H01L 23/49575; H01L 25/0657; H01L 25/074
See application file for complete search history.

(56) References Cited

U.S. PATENT DOCUMENTS

| | | |
|---|---|---|
| 2013/0026650 A1 | 1/2013 | Yamagata et al. |
| 2016/0056136 A1 | 2/2016 | McConnelee et al. |
| 2017/0207160 A1 | 7/2017 | Gowda et al. |
| 2017/0250093 A1 | 8/2017 | McConnelee et al. |
| 2018/0082857 A1 | 3/2018 | McConnelee et al. |
| 2021/0084762 A1 | 3/2021 | Akejima |
| 2021/0125914 A1* | 4/2021 | Harazono ............... H02M 7/48 |

* cited by examiner

SEMICONDUCTOR DEVICE INCLUDING SEMICONDUCTOR ELEMENTS, INSULATING BASE MEMBERS, WIRINGS, AND WIRING MEMBERS

This application claims priority from Japanese Patent Applications No. 2021-183972, filed on Nov. 11, 2021, the entire contents of which are herein incorporated by reference.

BACKGROUND

Technical Field

The present disclosure relates to a semiconductor device.

Background Art

There has been known a semiconductor device in which each of semiconductor elements is attached to a film of a resin such as polyimide through an adhesive layer and a wiring layer is formed on a face of the resin film on an opposite side to the adhesive layer (e.g. see JP-A-2016-046523).

On the other hand, further reduction of inductance generated in the semiconductor device is desired in order to achieve high-speed switching operation of the semiconductor device.

Accordingly, the present disclosure aims to provide a semiconductor device capable of reducing inductance.

SUMMARY

A certain embodiment provides a semiconductor device. The semiconductor device includes: a first semiconductor element including a first face and a second face opposite to the first face, wherein a first electrode is provided in the first face and a second electrode is provided in the second face; a second semiconductor element including a third face and a fourth face opposite to the third face, wherein a third electrode is provided in the third face and a fourth electrode is provided in the fourth face; a first insulating base member including a fifth face adhesively bonded to the first face of the first semiconductor element, and a sixth face opposite to the fifth face; a first wiring that penetrates through the first insulating base member to be electrically connected to the first electrode, and that is disposed on the sixth face of the first insulating base member; a second insulating base member including a seventh face adhesively bonded to the third face of the second semiconductor element, and an eighth face opposite to the seventh face; a second wiring that penetrates through the second insulating base member to be electrically connected to the third electrode, and that is disposed on the eighth face of the second insulating base member; a first wiring member that is electrically connected to the second electrode of the first semiconductor element; a second wiring member that faces the sixth face of the first insulating base member, and that is electrically connected to the first wiring and the fourth electrode of the second semiconductor element; and a third wiring member that faces the eighth face of the second insulating base member, and that is electrically connected to the second wiring. The first wiring member and the third wiring member face each other, and are electrically connected to each other. A current flows in a first direction in the first wiring member, and flows in a second direction opposite to the first direction in the third wiring member.

A certain embodiment provides a semiconductor device. The semiconductor device includes: a first semiconductor element including a first face and a second face opposite to the first face, wherein a first electrode is provided in the first face and a second electrode is provided in the second face; a second semiconductor element including a third face and a fourth face opposite to the third face, wherein a third electrode is provided in the third face and a fourth electrode is provided in the fourth face; a first insulating base member including a fifth face adhesively bonded to the first face of the first semiconductor element, and a sixth face opposite to the fifth face; a first wiring that penetrates through the first insulating base member to be electrically connected to the first electrode, and that is disposed on the sixth face of the first insulating base member; a second insulating base member including a seventh face adhesively bonded to the third face of the second semiconductor element, and an eighth face opposite to the seventh face; a second wiring that penetrates through the second insulating base member to be electrically connected to the third electrode, and that is disposed on the eighth face of the second insulating base member; a fourth wiring member that is electrically connected to the second electrode of the first semiconductor element; a fifth wiring member that faces the eighth face of the second insulating base member, and that is electrically connected to the second wiring; and an insulating fixation member that is disposed between the fourth wiring member and the fifth wiring member. The fourth wiring member and the fifth wiring member face each other, and are electrically connected to each other. A current flows in a first direction in the fourth wiring member, and flows in a second direction opposite to the first direction in the fifth wiring member.

DESCRIPTION OF EMBODIMENTS

Embodiments of the present disclosure will be described below specifically with reference to the accompanying drawings. Incidentally, in the description of the present disclosure and the drawings, constituent elements that have substantially the same functional configurations will be designated by the same reference signs correspondingly and respectively, and duplicated explanation about these constituent elements may be therefore omitted. In addition, in the present disclosure, an X1-X2 direction, a Y1-Y2 direction and a Z1-Z2 direction are set as directions mutually orthogonal to one another. A plane including the X1-X2 direction and the Y1-Y2 direction will be described as XY plane, a plane including the Y1-Y2 direction and the Z1-Z2 direction will be described as YZ plane, and a plane including the Z1-Z2 direction and the X1-X2 direction will be described as ZX plane. Incidentally, for convenience, the Z1-Z2 direction will be set as an up-down direction, with the Z1 side being an upper side and the Z2 side being a lower side. In addition, the term "plan view" will mean a view of an object from the Z1 side, and the term "planar shape" will mean the shape of the object viewed from the Z1 side. However, a semiconductor device can be used in a vertically inverted state, or can be disposed at any angle.

First Embodiment

First, a first embodiment will be described. The first embodiment relates to a semiconductor device.

[Configuration of Semiconductor Device]

Figure 1:
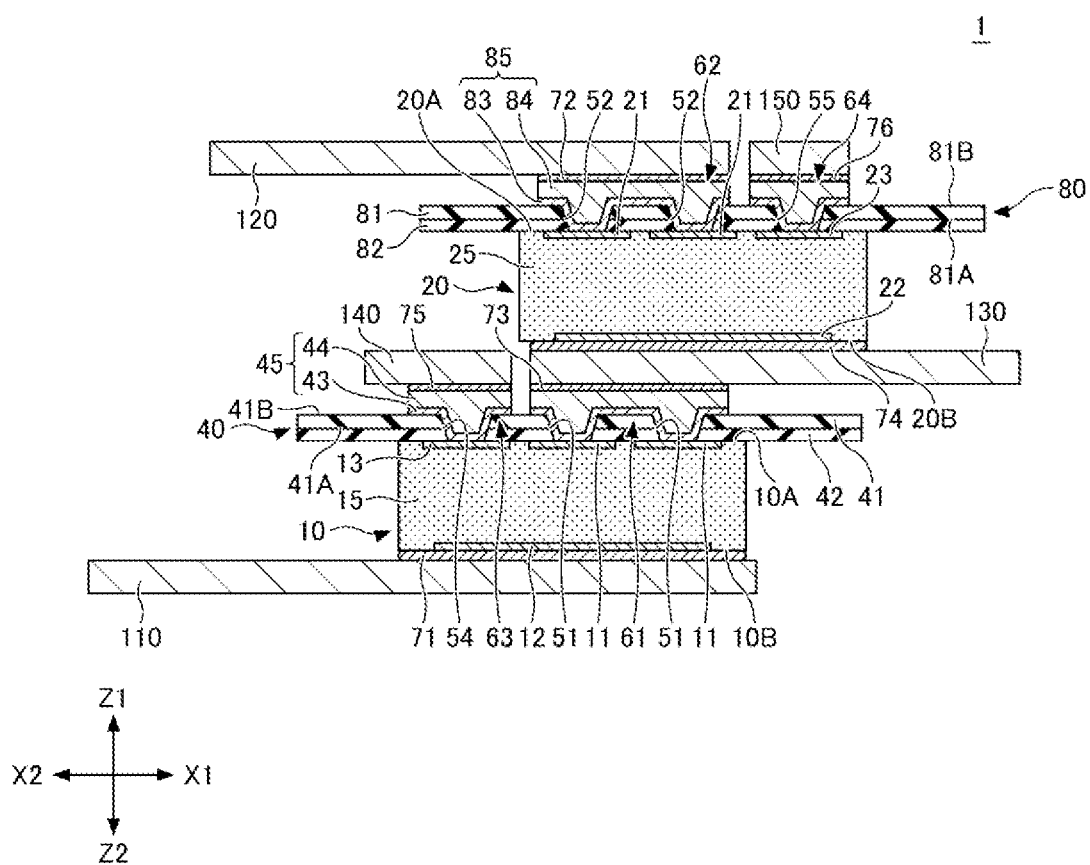
FIG. 1 is a sectional view showing a semiconductor device according to a first embodiment.

First, a sectional configuration of the semiconductor device according to the first embodiment will be described. FIG. 1 is a sectional view showing the semiconductor device according to the first embodiment.

As shown in FIG. 1, the semiconductor device 1 according to the first embodiment has a semiconductor element 10, a semiconductor element 20, a flexible wiring substrate 40, and a flexible wiring substrate 80. For example, a device using silicon (Si) or silicon carbide (SiC) can be used as each of the semiconductor elements 10 and 20. For example, a device using gallium nitride (GaN), gallium arsenide (GaAs) etc. also can be used as the semiconductor element 10, 20. For example, a semiconductor element acting as an active element (e.g. a silicon chip such as a CPU), an insulated gate bipolar transistor (IGBT), a metal-oxide-semiconductor field-effect transistor (MOSFET), a diode, etc. can be used as the semiconductor element 10, 20. The semiconductor element 10, 20 according to the present embodiment is a semiconductor element which includes electrodes provided in its front and back faces. The semiconductor element 10, 20 can be set to have any shape and any size in terms of the planar shape. The semiconductor element 10, 20 is, for example, formed into a rectangular shape in terms of the planar shape. Thickness of the semiconductor element 10, 20 can be, for example, set in a range of about 50 μm to 500 μm.

The semiconductor element 10 has one face 10A, and the other face 10B located on an opposite side to the face 10A. In addition, the semiconductor element 10 has a body portion 15, electrodes 11, an electrode 12, and an electrode 13. The electrodes 11 and the electrode 13 are provided in the face 10A, and the electrode 12 is provided in the other face 10B. For example, the electrodes 11, the electrode 12, and the electrode 13 can be set as source electrodes, a drain electrode, and a gate electrode, respectively.

The semiconductor element 20 has one face 20A, and the other face 20B located on an opposite side to the face 20A. In addition, the semiconductor element 20 has a body portion 25, electrodes 21, an electrode 22, and an electrode 23. The electrodes 21 and the electrode 23 are provided in the face 20A, and the electrode 22 is provided in the other face 20B. For example, the electrodes 21, the electrode 22, and the electrode 23 can be set as source electrodes, a drain electrode, and a gate electrode, respectively.

For example, any of metals such as aluminum (Al), silver (Ag) and copper (Cu), or a metal layer or an alloy containing at least one metal selected from these metals can be used as the material of the electrodes 11, the electrode 12, the electrode 13, the electrodes 21, the electrode 22, and the electrode 23 (which may be hereinafter generically referred to as "electrodes"). Incidentally, if occasions demand, a surface treatment layer may be formed on each of surfaces of the electrodes. Examples of the surface treatment layer include a gold (Au) layer, a nickel (Ni) layer/Au layer (a metal layer in which the Ni layer and the Au layer are deposited in the named order), an Ni layer/palladium (Pd) layer/Au layer (a metal layer in which the Ni layer, the Pd layer, and the Au layer are deposited in the named order), etc. For example, a metal layer formed by an electroless plating method (an electroless plated metal layer) can be used as each of the Au layer, the Ni layer, and the Pd layer. In addition, the Au layer is a metal layer made of Au or an Au alloy, and the Ni layer is a metal layer made of Ni or an Ni alloy, and the Pd layer is a metal layer made of Pd or a Pd alloy.

The flexible wiring substrate 40 has an insulating base member 41, an insulating adhesive layer 42, and a wiring layer 45. The insulating base member 41 has one face 41A, and the other face 41B located on an opposite side to the face 41A. The adhesive layer 42 is provided on the face 41A, and the wiring layer 45 is provided on the other face 41B. The wiring layer 45 is deposited on the other face 41B. The wiring layer 45 has a seed layer 43 and a metal layer 44.

The flexible wiring substrate 80 has an insulating base member 81, an insulating adhesive layer 82, and a wiring layer 85. The insulating base member 81 has one face 81A, and the other face 81B located on an opposite side to the face 81A. The adhesive layer 82 is provided on the face 81A, and the wiring layer 85 is provided on the other face 81B. The wiring layer 85 is formed on the other face 81B. The wiring layer 85 has a seed layer 83 and a metal layer 84.

The semiconductor device 1 further has a lead terminal 110, a lead terminal 120, a lead terminal 130, a lead terminal 140, and a lead terminal 150. Each of the lead terminals 110, 120, 130, 140 and 150 is, for example, formed from a lead frame.

The semiconductor element 10 is adhesively bonded to the face 41A of the insulating base member 41 by the adhesive layer 42. The face 10A of the semiconductor element 10 faces the face 41A of the insulating base member 41. Through holes 51 where the electrodes 11 are exposed, and a through hole 54 where the electrode 13 is exposed are formed in the insulating base member 41 and the adhesive layer 42.

For example, a resin film etc. can be used as the insulating base member 41. An insulating resin such as a polyimide-based resin, a polyethylene-based resin or an epoxy-based resin can be used as the material of the resin film. The insulating base member 41 has, for example, flexibility. Here, the term "flexibility" means a property of being able to be bent or flexed. The insulating base member 41 can be set to have any shape and any size in terms of the planar shape. The insulating base member 41 is, for example, formed into a rectangular shape in terms of the planar shape. Thickness of the insulating base member 41 can be, for example, set in a range of about 50 μm to 100 μm.

As the material of the adhesive layer 42, for example, an adhesive agent such as an epoxy-based adhesive agent, a polyimide-based adhesive agent, or a silicone-based adhesive agent can be used. Thickness of the adhesive layer 42 can be, for example, set in a range of about 20 μm to 40 μm.

For example, the electrodes 11 and the through holes 51 are located on an X1 side of the electrode 13 and the through hole 54. Pairs of the electrodes 11 and the through holes 51 may be provided.

The wiring layer 45 has a wiring 61 connected to the electrodes 11 through the through holes 51, and a wiring 63 connected to the electrode 13 through the through hole 54.

The wiring 61 includes via wirings filled in the through holes 51, and a wiring pattern formed on the other face 41B of the insulating base member 41. The wiring 63 includes a via wiring filled in the through hole 54, and a wiring pattern formed on the other face 41B of the insulating base member 41.

The seed layer 43 covers the other face 41B of the insulating base member 41 and inner faces of the through holes 51 and 54. The seed layer 43 is formed to continuously cover the other face 41B of the insulating base member 41, the inner faces of the through holes 51 and 54, and faces of the electrodes 11 and 13 exposed at the bottoms of the through holes 51 and 54. A metal film (sputtered film) formed by a sputtering method can be used as the seed layer 43. For example, a metal layer with a two-layer structure in which a titanium (Ti) layer made of Ti and a copper (Cu) layer made of Cu are sequentially deposited on the other face 41B of the insulating base member 41 and the inner faces of the through holes 51 and 54 can be used as the seed layer 43 formed by the sputtering method. In this case, thickness of the Ti layer can be, for example, set in a range of about 10 nm to 300 nm, and thickness of the Cu layer can be, for example, set in a range of about 100 nm to 1000 nm. Incidentally, the Ti layer functions as a close contact layer that improves close contact of the seed layer 43 with the insulating base member 41 and the electrodes etc. In addition, the Ti layer also functions as a metal barrier layer that restrains copper from diffusing from the Cu layer etc. into the insulating base member 41 etc. In addition to the Ti, titanium nitride (TiN), tantalum nitride (TaN), tantalum (Ta), chrome (Cr), etc. can be used as the material of such a metal film functioning as the close contact layer and the metal barrier layer.

The semiconductor element 20 is adhesively bonded to the face 81A of the insulating base member 81 by the adhesive layer 82. The face 20A of the semiconductor element 20 faces the face 81A of the insulating base member 81. Through holes 52 where the electrodes 21 are exposed and a through hole 55 where the electrode 23 is exposed are formed in the insulating base member 81 and the adhesive layer 82.

For example, a resin film can be used as the insulating base member 81. An insulating resin such as a polyimide-based resin, a polyethylene-based resin or an epoxy-based resin can be used as the material of the resin film. The insulating base member 81 has, for example, flexibility. Here, the term "flexibility" means a property of being able to be bent or flexed. The insulating base member 81 can be set to have any shape and any size in terms of the planar shape. The insulating base member 81 is, for example, formed into a rectangular shape in terms of the planar shape. Thickness of the insulating base member 81 can be, for example, set in a range of about 50 μm to 100 μm.

For example, an adhesive agent such as an epoxy-based adhesive agent, a polyimide-based adhesive agent, or a silicone-based adhesive agent can be used as the material of the adhesive layer 82. Thickness of the adhesive layer 82 can be, for example, set in a range of about 20 μm to 40 μm.

For example, the electrodes 21 and the through holes 52 are located on an X2 side of the electrode 23 and the through hole 55. Pairs of the electrodes 21 and the through holes 52 may be provided.

The wiring layer 85 has a wiring 62 connected to the electrodes 21 through the through holes 52, and a wiring 64 connected to the electrode 23 through the through hole 55.

The wiring 62 includes via wirings filled in the through holes 52, and a wiring pattern formed on the other face 81B of the insulating base member 81. The wiring 64 includes a via wiring filled in the through hole 55, and a wiring pattern formed on the other face 81B of the insulating base member 81.

The seed layer 83 covers the other face 81B of the insulating base member 81 and inner faces of the through holes 52 and 55. The seed layer 83 is formed to continuously cover the other face 81B of the insulating base member 81, the inner faces of the through holes 52 and 55, and faces of the electrodes 21 and 23 exposed at the bottoms of the through holes 52 and 55. A metal film (sputtered film) formed by a sputtering method can be used as the seed layer 83. For example, a metal layer with a two-layer structure in which a titanium (Ti) layer made of Ti and a copper (Cu) layer made of Cu are sequentially deposited on the other face 81B of the insulating base member 81 and the inner faces of the through holes 52 and 55 can be used as the seed layer 83 formed by the sputtering method. In this case, thickness of the Ti layer can be, for example, set in a range of about 10 nm to 300 nm, and thickness of the Cu layer can be, for example, set in a range of about 100 nm to 1000 nm. Incidentally, the Ti layer functions as a close contact layer that improves close contact of the seed layer 83 with the insulating base member 41 and the electrodes etc. In addition, the Ti layer also functions as a metal barrier layer that restrains copper from diffusing from the Cu layer etc. into the insulating base member 81 etc. In addition to the Ti, titanium nitride (TiN), tantalum nitride (TaN), tantalum (Ta), chrome (Cr), etc. can be used as the material of such a metal film functioning as the close contact layer and the metal barrier layer.

For example, copper or a copper alloy can be used as the material of the metal layers 44 and 84. For example, a metal layer formed by an electrolytic plating method (an electrolytic plated metal layer) can be used as each of the metal layers 44 and 84.

The semiconductor element 10 and the semiconductor element 20 overlap with each other in the Z1-Z2 direction. The semiconductor element 20 is located on an upper side (Z1 side) of the semiconductor element 10, and the face 10A of the semiconductor element 10 and the other face 20B of the semiconductor element 20 face each other.

The lead terminal 110 is bonded to the electrode 12 of the semiconductor element 10 by an electrically conductive adhesive layer 71. The lead terminal 120 is bonded to the wiring 62 of the wiring layer 85 by an electrically conductive adhesive layer 72. The lead terminal 130 is bonded to the wiring 61 of the wiring layer 45 by an electrically conductive adhesive layer 73, and bonded to the electrode 22 of the semiconductor element 20 by an electrically conductive adhesive layer 74. The lead terminal 140 is bonded to the wiring 63 of the wiring layer 45 by an electrically conductive adhesive layer 75. The lead terminal 150 is bonded to the wiring 64 of the wiring layer 85 by an electrically conductive adhesive layer 76. The electrically conductive adhesive layers 71 to 76 are, for example, solder layers or sintered metal layers. The electrically conductive adhesive layers 71 to 76 may be made of an electrically conductive paste. The semiconductor elements 10 and 20 are fixed to each other through the electrically conductive adhesive layers 73 and 74.

The lead terminal 110 and the lead terminal 120 face each other in the Z1-Z2 direction, and are electrically connected to each other.

The lead terminals 110 and 120 extend in parallel with each other toward the X2 side as viewed from the semiconductor elements 10 and 20. A distance between the lead terminal 110 and the lead terminal 120 is nearly comparable to the sum of the thickness of the semiconductor element 10, the thickness of the flexible wiring substrate 40, the thickness of the semiconductor element 20 and thickness of the flexible wiring substrate 80. For example, the distance between the lead terminal 110 and the lead terminal 120 is 1 mm or less. In addition, the lead terminal 130 extends toward the X1 side as viewed from the semiconductor elements 10 and 20.

The electrode 12 of the semiconductor element 10 is electrically connected to the lead terminal 110. The electrodes 21 of the semiconductor element 20 are electrically connected to the lead terminal 120. The electrodes 11 of the semiconductor element 10 and the electrode 22 of the semiconductor element 20 are electrically connected to the lead terminal 130. Moreover, the lead terminal 140 is electrically connected to the electrode 13 of the semiconductor element 10, and the lead terminal 150 is electrically connected to the electrode 23 of the semiconductor element 20.

Figure 2:
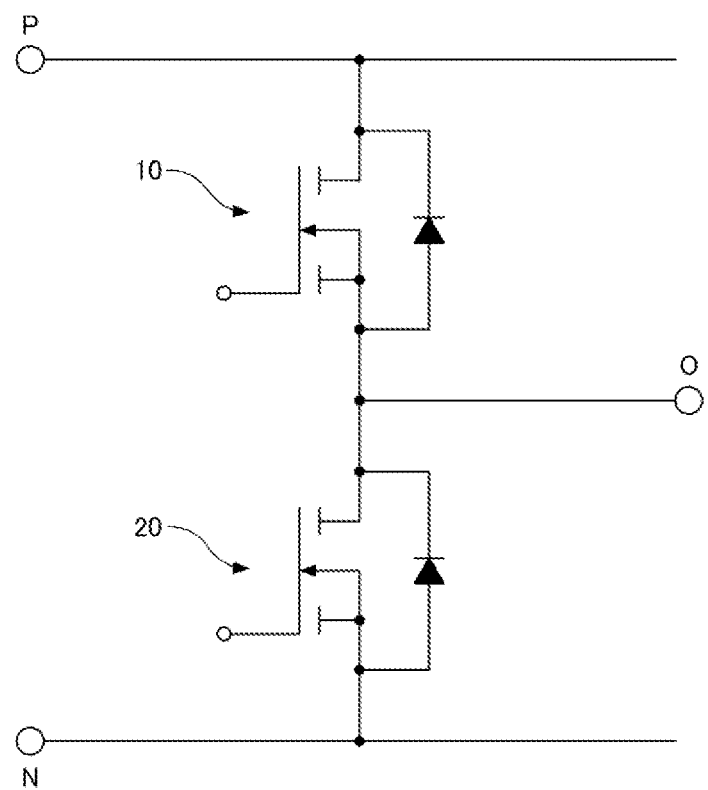
FIG. 2 is a circuit diagram showing the semiconductor device according to the first embodiment.

Here, a circuit configuration of the semiconductor device 1 according to the first embodiment will be described. FIG. 2 is a circuit diagram showing the semiconductor device according to the first embodiment.

As shown in FIG. 2, the electrode 12 of the semiconductor element 10 is electrically connected to a P terminal through the lead terminal 110. The electrodes 21 of the semiconductor element 20 are electrically connected to an N terminal through the lead terminal 120. Moreover, the electrodes 11 of the semiconductor element 10 and the electrode 22 of the semiconductor element 20 are electrically connected to an O terminal through the lead terminal 130. The P terminal is a positive input terminal, the N terminal is a negative input terminal, and the O terminal is an output terminal. Accordingly, a current flows in the lead terminal 110 in a reverse direction to a direction in which the current flows in the lead terminal 120.

[Method for Manufacturing Semiconductor Devices]

Next, a method for manufacturing the semiconductor devices according to the first embodiment will be described. FIGS. 3A to 3D, FIGS. 4A to 4D, and FIGS. 5A to 5C are sectional views showing the method for manufacturing the semiconductor devices according to the first embodiment. In the following description, a so-called multiple-piece manufacturing method will be described. That is, a part corresponding to a large number of semiconductor devices 1 is produced by batch and then divided into individual pieces to manufacture the semiconductor devices 1. Incidentally, for convenience of explanation, portions that will finally become constituent elements of each of the semiconductor devices 1 will be designated by the same reference signs as those for the final constituent elements.

Figure 3A:
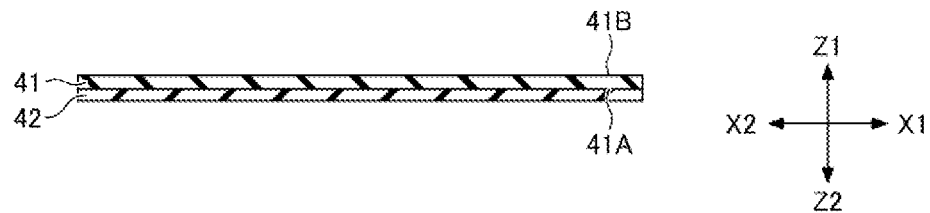
FIGS. 3A to 3D are sectional views showing a method for manufacturing each semiconductor device according to the first embodiment (Part 1)

First, as shown in FIG. 3A, a large-sized insulating base member 41 having one face 41A and the other face 41B is prepared. In the large-sized insulating base member 41, for example, a plurality of individual regions in each of which a semiconductor device 1 should be formed are consecutively provided in a matrix form. Here, the individual regions are regions each of which will be finally cut into an individual piece along predetermined cutting lines to form the individual semiconductor device 1. Incidentally, the number of the individual regions contained in the large-sized insulating base member 41 is not limited particularly. An insulating adhesive layer 42 that covers the entire face 41A of the insulating base member 41 is provided on the face 41A.

Figure 3B:
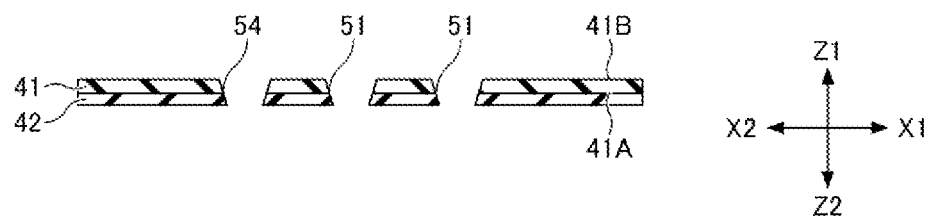

Next, as shown in FIG. 3B, through holes 51 and 54 are formed at required places in the insulating base member 41 and the adhesive layer 42 to penetrate through the insulating base member 41 and the adhesive layer 42 in a thickness direction. The through holes 51 and 54 can be formed, for example, by a laser machining method using a $CO_2$ laser, a UV-YAG laser, etc. or by a punching method. For example, the through holes 51 are formed on an X1 side of the through hole 54.

Figure 3C:
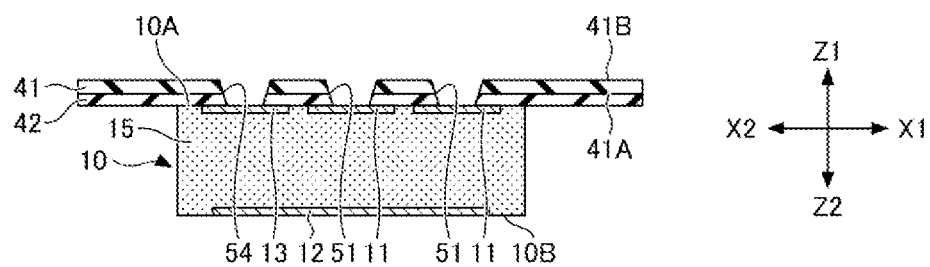

Next, as shown in FIG. 3C, a semiconductor element 10 is adhesively bonded to the insulating base member 41 by the adhesive layer 42. On this occasion, alignment is performed to make one face 10A of the semiconductor element 10 face the face 41A of the insulating base member 41, so that electrodes 11 overlap with the through holes 51 and an electrode 13 overlaps with the through hole 54 in plan view.

Figure 3D:
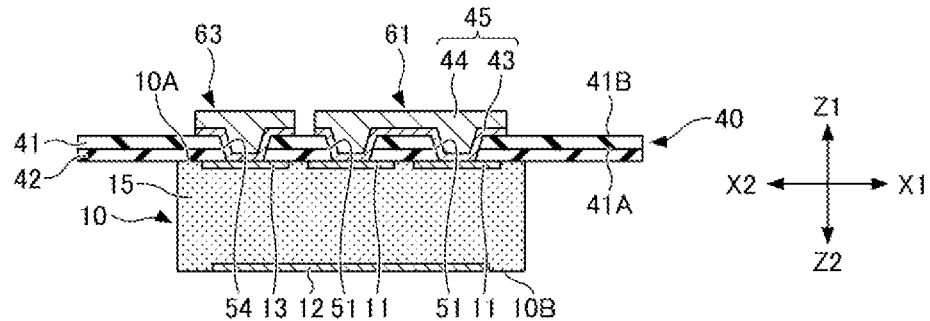

Next, as shown in FIG. 3D, a wiring layer 45 including a seed layer 43 and a metal layer 44 is formed on the other face 41B of the insulating base member 41. The wiring layer can be formed, for example, by a semi-additive method.

Specifically, the seed layer 43 is formed to cover the entire other face 41B of the insulating base member 41 and entire inner faces of the through holes 51 and 54. The seed layer 43 can be formed, for example, by a sputtering method or an electroless plating method.

In the case where, for example, the seed layer 43 is formed by the sputtering method, first, titanium is deposited by sputtering to form a Ti layer to thereby cover the other face 41B of the insulating base member 41 and the inner faces of the through holes 51 and 54. Then, copper is deposited on the Ti layer by sputtering to form a Cu layer. Thus, the seed layer 43 having a two-layer structure (the Ti layer/the Cu layer) can be formed. Moreover, in the case where the seed layer 43 is formed by the electroless plating method, for example, the seed layer 43 consisting of a Cu layer (one-layer structure) can be formed by an electroless copper plating method.

Next, a plating resist layer (not shown) is formed on the seed layer 43. The plating resist layer has opening portions provided in a portion where the wiring layer 45 should be formed, i.e. the portion where a wiring 61 and a wiring 63 should be formed. Successively, the metal layer 44 made of copper or the like is formed in the opening portions of the plating resist layer by an electrolytic plating method using the seed layer 43 as a plating power feed path. Then, the plating resist layer is removed. Next, with the metal layer 44 used as a mask, the seed layer 43 is removed by wet etching. In this manner, the wiring layer 45 including the seed layer 43 and the metal layer 44 can be formed. The wiring layer 45 has the wirings 61 and 63. A flexible wiring substrate 40 is constituted by the insulating base member 41, the adhesive layer 42, and the wiring layer 45.

Figure 4A:
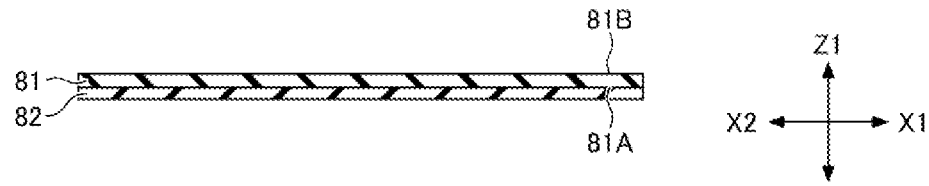
FIGS. 4A to 4D are sectional views showing the method for manufacturing the semiconductor device according to the first embodiment (Part 2)

Moreover, as shown in FIG. 4A, a large-sized insulating base member 81 having one face 81A and the other face 81B is prepared. In the large-sized insulating base member 81, for example, a plurality of individual regions in each of which the semiconductor device 1 should be formed are consecutively provided in a matrix form. Here, the individual regions are regions each of which will be finally cut into the individual piece along predetermined cutting lines to form the individual semiconductor device 1. Incidentally, the number of the individual regions contained in the large-sized insulating base member 81 is not limited particularly. An insulating adhesive layer 82 that covers the entire face 81A of the insulating base member 81 is provided on the face 81A.

Figure 4B:
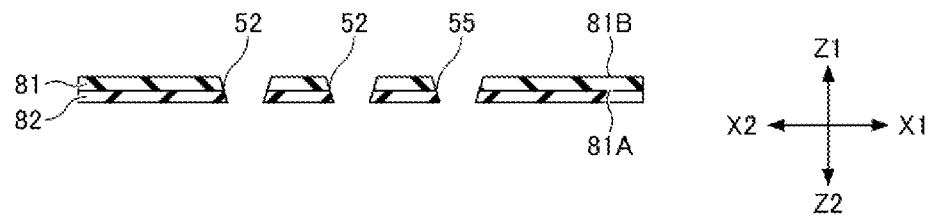

Next, as shown in FIG. 4B, through holes 52 and 55 are formed at required places in the insulating base member 81 and the adhesive layer 82 to penetrate through the insulating base member 81 and the adhesive layer 82 in the thickness direction. The through holes 51 and 54 can be formed, for example, by a method the same as or similar to the through holes 52 and 55. For example, the through holes 52 are formed on an X2 side of the through hole 55.

Figure 4C:
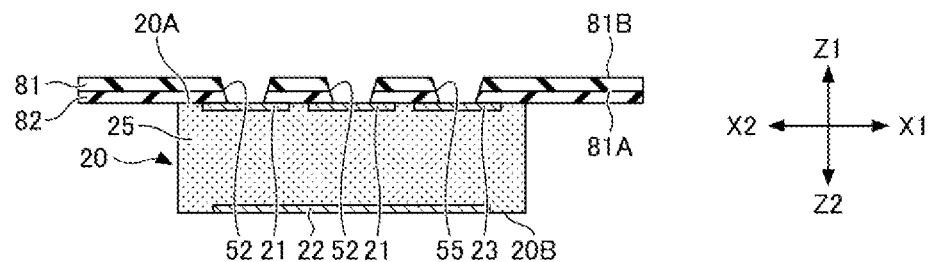

Next, as shown in FIG. 4C, a semiconductor element 20 is adhesively bonded to the insulating base member 81 by the adhesive layer 82. On this occasion, alignment is performed to make one face 20A of the semiconductor element 20 face the face 81A of the insulating base member 81, so that electrodes 21 overlap with the through holes 52 and an electrode 23 overlaps with the through hole 55 in the plan view.

Figure 4D:
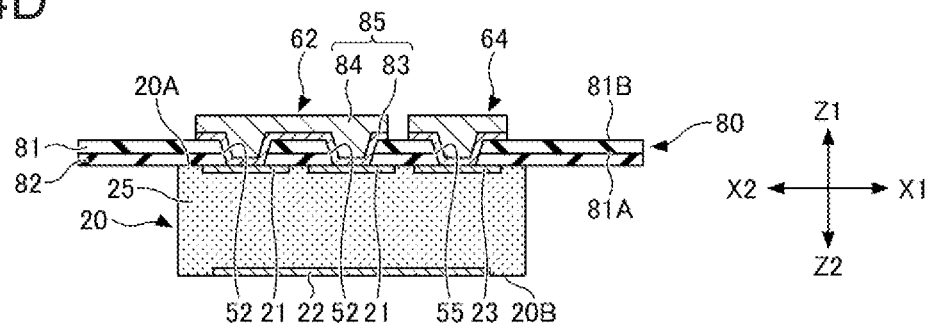

Next, as shown in FIG. 4D, a wiring layer 85 including a seed layer 83 and a metal layer 84 is formed on the other face 81B of the insulating base member 81. The wiring layer 85 can be formed, for example, by a method the same as or similar to the wiring layer 45. The wiring layer 85 has wirings 62 and 64. A flexible wiring substrate 80 is constituted by the insulating base member 81, the adhesive layer 82 and the wiring layer 85.

Figure 5A:
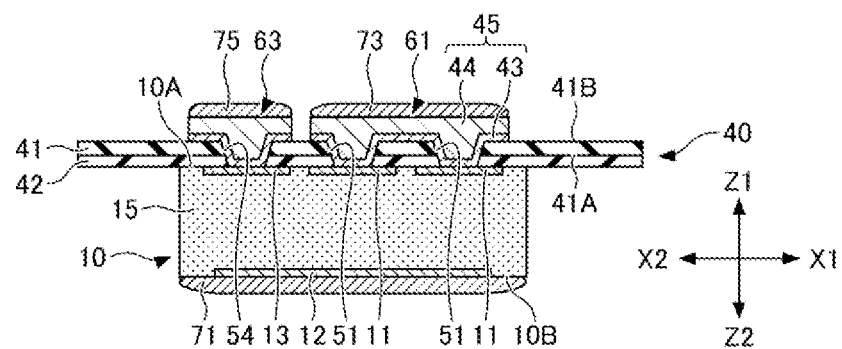
FIGS. 5A to 5C are sectional views showing the method for manufacturing the semiconductor device according to the first embodiment (Part 3)

After the wiring layer 45 is formed, an electrically conductive adhesive layer 71 is provided on the other face 10B of the semiconductor element 10, an electrically conductive adhesive layer 73 is provided on a Zi-side face of the wiring 61 of the wiring layer 45, and an electrically conductive adhesive layer 75 is provided on a Z1-side face of the wiring 63, as shown in FIG. 5A. The electrically conductive adhesive layers 71, 73 and 75 are in an uncured state.

Figure 5B:
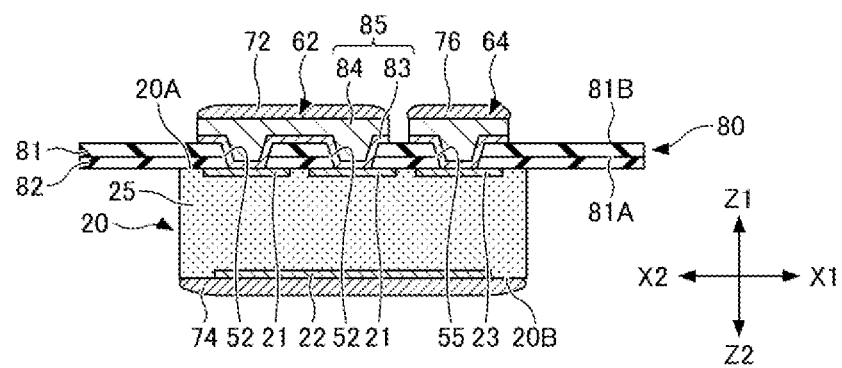

Moreover, after the wiring layer 85 is formed, an electrically conductive adhesive layer 74 is provided on the other face 20B of the semiconductor element 20, an electrically conductive adhesive layer 72 is provided on a Z1-side face of the wiring 62 of the wiring layer 85, and an electrically conductive adhesive layer 76 is provided on a Z1-side face of the wiring 64, as shown in FIG. 5B. The electrically conductive adhesive layers 72, 74 and 76 are in an uncured state.

Figure 5C:
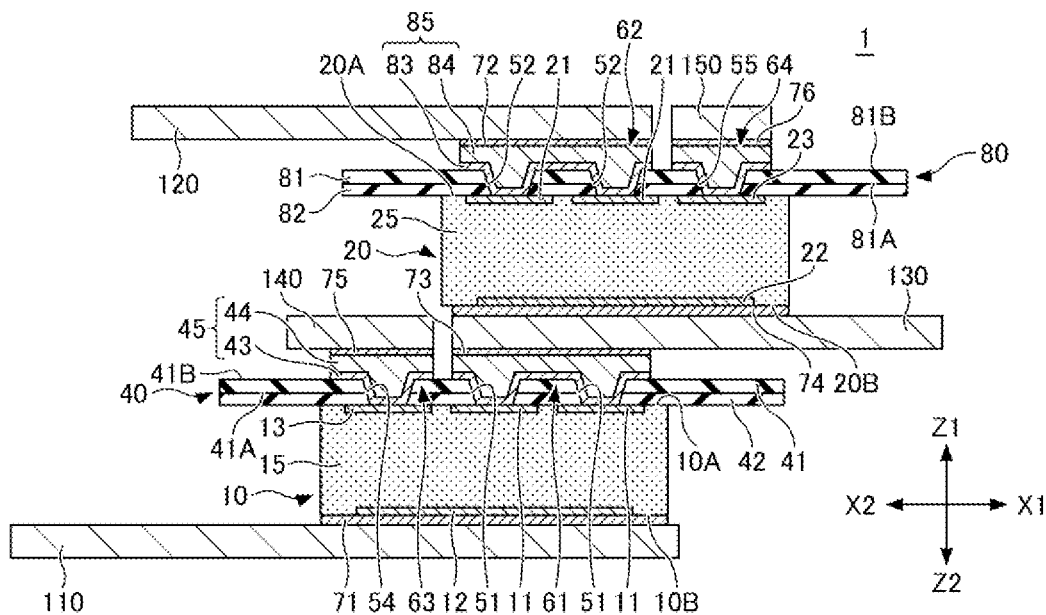

Then, as shown in FIG. 5C, a lead terminal 110 is bonded to an electrode 12 by the electrically conductive adhesive layer 71, a lead terminal 130 is bonded to the wiring 61 by the electrically conductive adhesive layer 73 and bonded to an electrode 22 by the electrically conductive adhesive layer 74, and a lead terminal 140 is bonded to the wiring 63 by the electrically conductive adhesive layer 75. Moreover, the lead terminal 120 is bonded to the wiring 62 by the electrically conductive adhesive layer 72, and a lead terminal 150 is bonded to the wiring 64 by the electrically conductive adhesive layer 76. During the bonding, the electrically conductive adhesive layers 71 to 76 are cured.

In this manner, the semiconductor device 1 according to the first embodiment can be manufactured.

In the semiconductor device 1 according to the first embodiment, a current flows from a P terminal to an N terminal. Therefore, in the lead terminal 110, the current flows from the X2 side toward the X1 side, and in the lead terminal 120, the current flows from the X1 side toward the X2 side. Moreover, in the present embodiment, a distance between the lead terminal 110 and the lead terminal 120 is roughly defined by the sum of thickness of the semiconductor element 10, thickness of the flexible wiring substrate 40, thickness of the lead terminal 130 (or the lead terminal 140), thickness of the semiconductor element 20, and thickness of the flexible wiring substrate 80. Thus, the distance between the lead terminal 110 and the lead terminal 120 becomes sufficiently small so that inductance between the lead terminal 110 and the lead terminal 120 which are parallel reciprocating conducting lines can be reduced. Accordingly, it is possible to provide the semiconductor device 1 that can achieve high-speed switching operation.

Moreover, the wiring layer 45 can be formed on the other face 41B of the insulating base member 41 finely and with high accuracy by the semi-additive method, and the wiring layer 85 can be formed on the other face 81B of the insulating base member 81 finely and with high accuracy by the semi-additive method. The wiring layer 45 and the wiring layer 85 may be alternatively formed by a subtractive method. Furthermore, the semiconductor element 10 is adhesively bonded to the face 41A of the insulating base member 41 by the adhesive layer 42 so that the position of the semiconductor element 10 can be fixed to the insulating base member 41 and the wiring layer 45, and the semiconductor element 20 is adhesively bonded to the face 81A of the insulating base member 81 by the adhesive layer 82 so that the position of the semiconductor element 20 can be fixed to the insulating base member 81 and the wiring layer 85. Therefore, according to the present embodiment, it is possible to obtain excellent positional accuracy and connection reliability. Particularly, the semiconductor elements 10 and can be aligned with high accuracy. Further, it is possible to secure high connection reliability between the semiconductor element 10 and the insulating base member 41, and it is possible to secure high connection reliability between the semiconductor element 20 and the insulating base member 81.

Assume that a semiconductor device (power module) in which each of semiconductor elements is fixed to a metal foil (such as a copper foil) provided on the surface of an insulating substrate (such as a ceramic substrate) is manufactured as a reference example. In manufacturing such a semiconductor device, solder reflow is performed to fix the semiconductor element, so that the semiconductor element may be considerably misaligned during the reflow process. Therefore, a relatively large margin is required for the placement of the semiconductor element in a design phase.

On the other hand, in the present embodiment, the semiconductor element 10 is adhesively bonded to the insulating base member 41 in which the through holes 51 and 54 have been formed, and the wiring layer 45 is formed by the semi-additive method. In addition, the semiconductor element 20 is adhesively bonded to the insulating base member 81 in which the through holes 52 and 55 have been formed, and the wiring layer 85 is formed by the semi-additive method. Therefore, excellent positional accuracy and connection reliability can be obtained so that large margins as in the reference example are not required.

Second Embodiment

Figure 6:
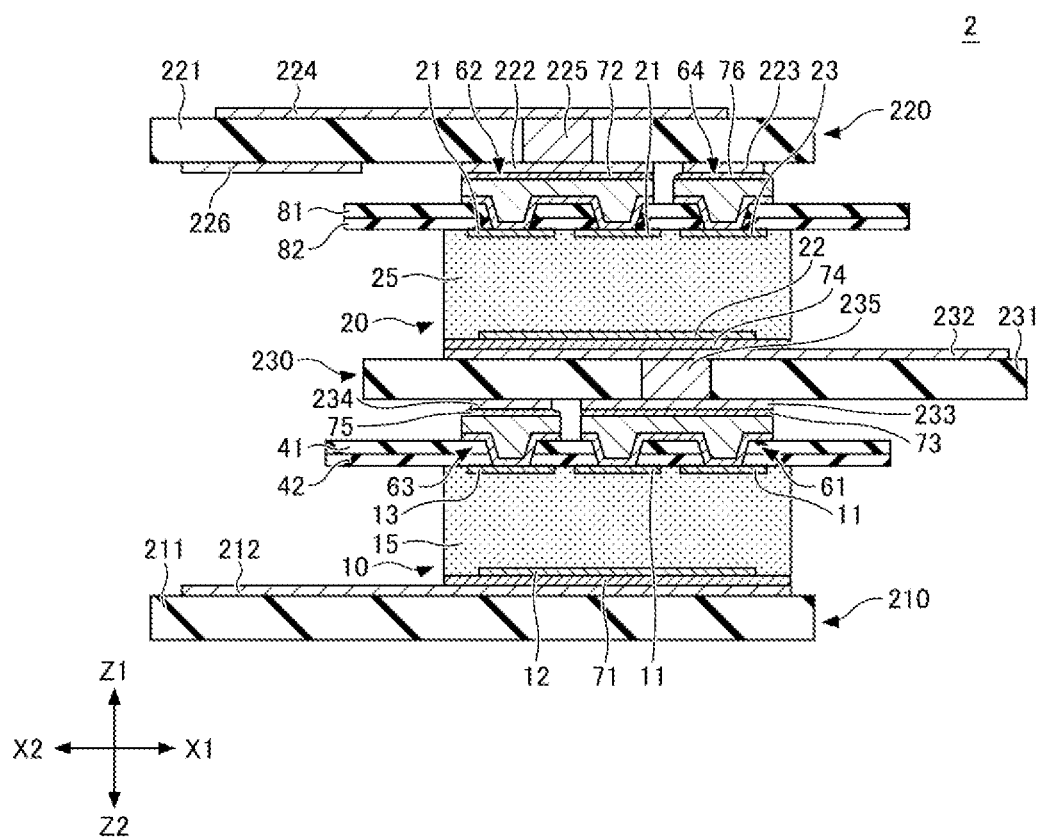
FIG. 6 is a sectional view showing a semiconductor device according to a second embodiment.

Next, a second embodiment will be described. FIG. 6 is a sectional view showing a semiconductor device according to the second embodiment.

As shown in FIG. 6, the semiconductor device 2 according to the second embodiment has a wiring substrate 210 in place of the lead terminal 110, has a wiring substrate 220 in place of the lead terminals 120 and 150, and has a wiring substrate 230 in place of the lead terminals 130 and 140.

The wiring substrate 210 has an insulating layer 211 and a wiring layer 212. The wiring layer 212 is provided on an upper face (Z1-side face) of the insulating layer 211. The material of the insulating layer 211 may be an inorganic material, may be an organic material, or may be a composite material. The material of the wiring layer 212 is, for example, copper or a copper alloy. The wiring layer 212 is bonded to an electrode 12 of a semiconductor element by an electrically conductive adhesive layer 71.

The wiring substrate 220 has an insulating layer 221, a wiring layer 222, a wiring layer 223, a wiring layer 224, a via conductor 225 and a wiring layer 226. The wiring layers 222, 223, and 226 are provided on a lower face (Z2-side face) of the insulating layer 221, and the wiring layer 224 is provided on an upper face (Z1-side face) of the insulating layer 221. The via conductor 225 penetrates through the insulating layer 221 to be connected to the wiring layers 222 and 224. The material of the insulating layer 221 may be an inorganic material, may be an organic material, or may be a composite material. The material of the wiring layers 222, 223, 224 and 226 and the material of the via conductor 225 are, for example, copper or a copper alloy. The wiring layer 222 is bonded to a wiring 62 of a wiring layer 85 by an electrically conductive adhesive layer 72, and the wiring layer 223 is bonded to a wiring 64 of the wiring layer 85 by an electrically conductive adhesive layer 76. The wiring substrate 210 and the wiring substrate 220 face each other in a Z1-Z2 direction, and are electrically connected to each other.

The wiring substrate 230 has an insulating layer 231, a wiring layer 232, a wiring layer 233, a wiring layer 234, and a via conductor 235. The wiring layer 232 is provided on an upper face (Z1-side face) of the insulating layer 231, and the wiring layers 233 and 234 are provided on a lower face (Z2-side face) of the insulating layer 231. The via conductor 235 penetrates through the insulating layer 231 to be connected to the wiring layers 232 and 233. The material of the insulating layer 231 may be an inorganic material, may be an organic material, or may be a composite material. The material of the wiring layers 232, 233 and 234 and the material of the via conductor 235 are, for example, copper or a copper alloy. The wiring layer 233 is bonded to a wiring 61 of a wiring layer 45 by an electrically electric adhesive layer 73, and the wiring layer 232 is bonded to an electrode 22 of a semiconductor element 20 by an electrically conductive adhesive layer 74. In addition, the wiring layer 234 is bonded to a wiring 63 of the wiring layer 45 by an electrically conductive adhesive layer 75.

The wiring substrate 210 includes a wiring layer (e.g. the wiring layer 212) extending toward an X2 side as viewed from the semiconductor elements 10 and 20. The wiring substrate 220 includes a wiring layer (e.g. the wiring layer 224) that extends toward the X2 side as viewed from the semiconductor elements 10 and 20. In addition, the wiring substrate 230 includes a wiring layer (e.g. the wiring layer 232) extending toward an X1 side as viewed from the semiconductor elements 10 and 20.

The remaining configuration is the same as or similar to that in the first embodiment.

In order to manufacture the semiconductor device 2 according to the second embodiment, the wiring substrates 210, 220 and 230 are prepared in advance. Then, the wiring substrate 210 is bonded to the semiconductor element 10 in place of the lead terminal 110, the wiring substrate 230 is bonded to the semiconductor element 20 and the wiring layer 45 in place of the lead terminals 130 and 140, and the wiring substrate 220 is bonded to the wiring layer 85 in place of the lead terminals 120 and 150. In this manner, the semiconductor device 2 can be manufactured.

In the semiconductor device 2 according to the second embodiment, a current also flows from a P terminal to an N terminal. Therefore, in the wiring substrate 210, the current flows from the X2 side toward the X1 side, and in the wiring substrate 220, the current flows from the X1 side toward the X2 side. In addition, a distance between the wiring substrate 210 and the wiring substrate 220 is roughly defined by the sum of thickness of the semiconductor element 10, thickness of a flexible wiring substrate 40, thickness of the wiring substrate 230, thickness of the semiconductor element 20, and thickness of a flexible wiring substrate 80. Thus, the distance between the wiring substrate 210 and the wiring substrate 220 becomes sufficiently small so that inductance between the wiring substrate 210 and the wiring substrate 220 which are parallel reciprocating conducting lines can be reduced. Accordingly, it is possible to provide the semiconductor device 2 that can achieve high-speed switching operation.

In addition, in a manner the same as or similar to that in the first embodiment, the semiconductor element 10 is adjacently bonded to an insulating base member 41 where through holes 51 and 54 have been formed, and the wiring layer 45 is formed by a semi-additive method. Moreover, the semiconductor element 20 is adhesively bonded to an insulating base member 81 where through holes 52 and 55 have been formed, and the wiring layer 85 is formed by a semi-additive method. Therefore, excellent positional accuracy and connection reliability can be obtained.

Third Embodiment

Figure 7:
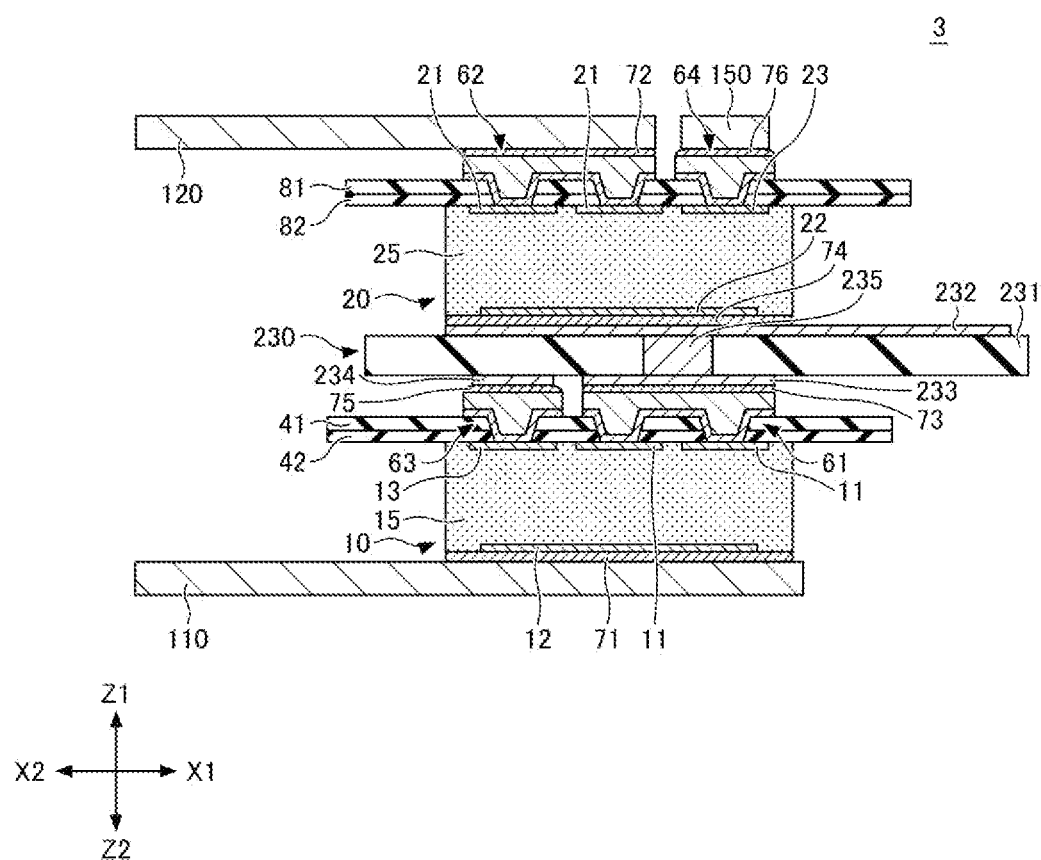
FIG. 7 is a sectional view showing a semiconductor device according to a third embodiment.

Next, a third embodiment will be described. FIG. 7 is a sectional view showing a semiconductor device according to the third embodiment.

As shown in FIG. 7, the semiconductor device 3 according to the third embodiment has a wiring substrate 230 in place of the lead terminals 130 and 140. The wiring substrate 230 has a configuration the same as or similar to that according to the second embodiment.

The remaining configuration is the same as or similar to that in the first embodiment.

Effects the same as or similar to those in the first and second embodiments can be also obtained by the third embodiment.

Fourth Embodiment

Figure 8:
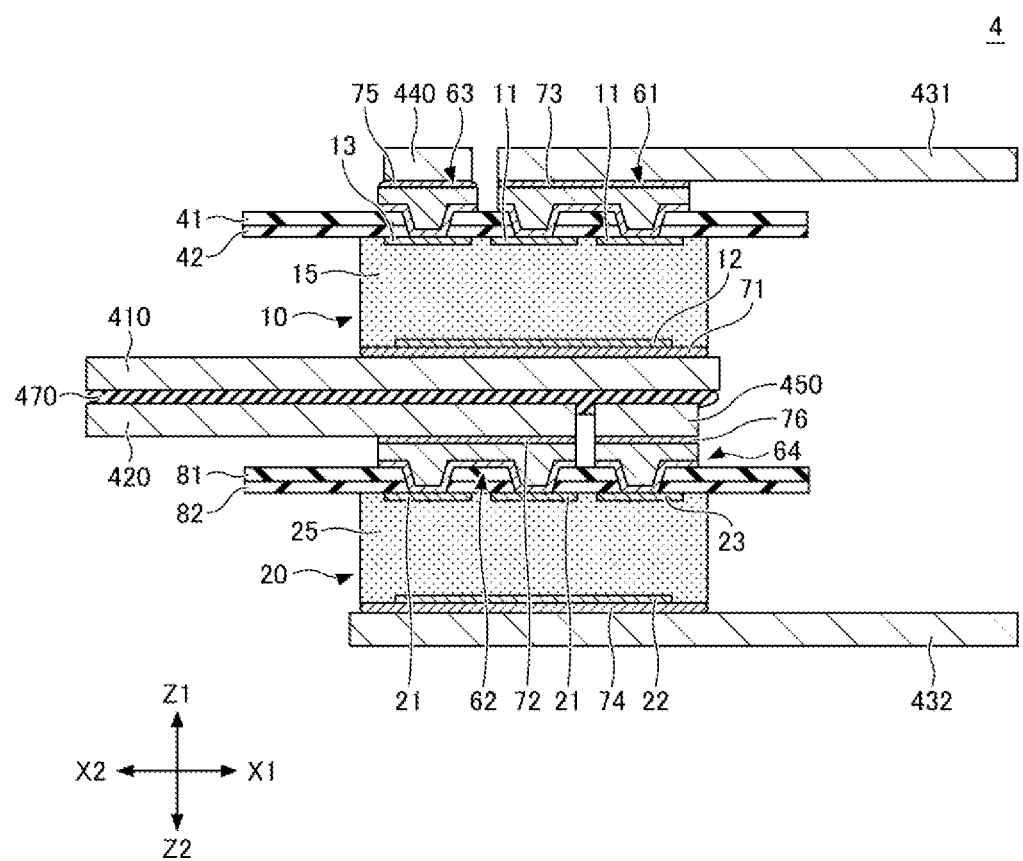
FIG. 8 is a sectional view showing a semiconductor device according to a fourth embodiment.

Next, a fourth embodiment will be described. FIG. 8 is a sectional view showing a semiconductor device 4 according to the fourth embodiment.

As shown in FIG. 8, the semiconductor device 4 according to the fourth embodiment has lead terminals 410, 420, 431, 432, 440 and 450 in place of the lead terminals 110, 120, 130, 140 and 150. Each of the lead terminals 410, 420, 431, 432, 440 and 450 is, for example, formed from a lead frame. Moreover, a semiconductor element 10 is on a Z1 side of a semiconductor element 20.

The lead terminal 410 is bonded to an electrode 12 of the semiconductor element 10 by an electrically conductive adhesive layer 71. The lead terminal 420 is bonded to a wiring 62 of a wiring layer 85 by an electrically conductive adhesive layer 72. The lead terminal 431 is bonded to a wiring 61 of a wiring layer 45 by an electrically conductive adhesive layer 73.

The lead terminal 432 is bonded to an electrode 22 of the semiconductor element 20 by an electrically conductive adhesive layer 74. The lead terminal 440 is bonded to a wiring 63 of the wiring layer 45 by an electrically conductive adhesive layer 75. The lead terminal 450 is bonded to a wiring 64 of the wiring layer 85 by an electrically conductive adhesive layer 76.

The lead terminal 410 is bonded to the lead terminals 420 and 450 by an insulating adhesive layer 470. The lead terminals 420 and 450 are fixed to the lead terminal 410 by the insulating adhesive layer 470. For example, an adhesive agent such as an epoxy-based adhesive agent, a polyimide-based adhesive agent, or a silicone-based adhesive agent can be used as the material of the insulating adhesive layer 470. The semiconductor elements 10 and 20 are fixed to each other through the insulating adhesive layer 470. The semiconductor elements 10 and are fixed to each other through the electrically conductive adhesive layers 71, 72 and 76. Thickness of the insulating adhesive layer 470 is in a range of about 50 μm to 1000 μm.

The lead terminals 410 and 420 extend in parallel with each other toward an X2 side as viewed from the semiconductor elements 10 and 20. A distance between the lead terminal 410 and the lead terminal 420 is nearly comparable to the thickness of the insulating adhesive layer 470. In addition, the lead terminals 431 and 432 extend toward an X1 side as viewed from the semiconductor elements 10 and 20.

The lead terminal 410 and the lead terminal 420 face each other in a Z1-Z2 direction through the insulating adhesive layer 470, and are electrically connected to each other.

The electrode 12 of the semiconductor element 10 is electrically connected to the lead terminal 410. Electrodes 21 of the semiconductor element 20 are electrically connected to the lead terminal 420. Electrodes 11 of the semiconductor element 10 are electrically connected to the lead terminal 431. The electrode 22 of the semiconductor element 20 is electrically connected to the lead terminal 432. Moreover, the lead terminal 440 is electrically connected to an electrode 13 of the semiconductor element 10, and the lead terminal 450 is electrically connected to an electrode 23 of the semiconductor element 20.

The electrode 12 of the semiconductor element 10 is electrically connected to a P terminal through the lead terminal 410. The electrodes 21 of the semiconductor element 20 are electrically connected to an N terminal through the lead terminal 420. Moreover, the electrodes 11 of the semiconductor element 10 are electrically connected to an O terminal through the lead terminal 431, and the electrode 22 of the semiconductor element 20 is electrically connected to the O terminal through the lead terminal 432. That is, the wiring 61 of the wiring layer 45 and the electrode 22 of the semiconductor element 20 are electrically connected to each other. As described above, the P terminal is a positive input terminal, the N terminal is a negative input terminal, and the O terminal is an output terminal. Accordingly, a current flows in the lead terminal 410 in a reverse direction to a direction in which the current flows in the lead terminal 420.

The remaining configuration is the same as that in the first embodiment.

In order to manufacture the semiconductor device 4 according to the fourth embodiment, the lead terminal 410 is bonded to the electrode 12 by the electrically conductive adhesive layer 71, the lead terminal 431 is bonded to the wiring 61 by the electrically conductive adhesive layer 73, and the lead terminal 440 is bonded to the wiring 63 by the electrically conductive adhesive layer 75. Moreover, the lead terminal 420 is bonded to the wiring 62 by the electrically conductive adhesive layer 72, the lead terminal 450 is bonded to the wiring 64 by the electrically conductive adhesive layer 76, and the lead terminal 432 is bonded to the electrode 22 by the electrically conductive adhesive layer 74. Then, the lead terminal 410 is bonded to the lead terminals 420 and 450 by the insulating adhesive layer 470. In this manner, the semiconductor device 4 can be manufactured.

Effects the same as or similar to those in the first embodiment can be also obtained by the fourth embodiment. Specifically, a distance between the lead terminal 410 and the lead terminal 420 is defined by the thickness of the insulating adhesive layer 470. Thus, the distance between the lead terminal 410 and the lead terminal 420 becomes sufficiently small so that inductance between the lead terminal 410 and the lead terminal 420 which are parallel reciprocating conducting lines can be reduced. Accordingly, it is possible to provide the semiconductor device 4 that can achieve high-speed switching operation.

Furthermore, according to the fourth embodiment, a distance between the lead terminal 431 and the lead terminal 432 is roughly defined by the sum of thickness of the semiconductor element 20, thickness of a flexible wiring substrate 80, thickness of the lead terminal 420, the thickness of the insulating adhesive layer 470, thickness of the lead terminal 410, thickness of the semiconductor element 10, and thickness of a flexible wiring substrate 40. Thus, the distance between the lead terminal 431 and the lead terminal 432 becomes sufficiently small so that inductance between the lead terminal 431 and the lead terminal 432 which are parallel reciprocating conducting lines can be reduced.

Fifth Embodiment

Figure 9:
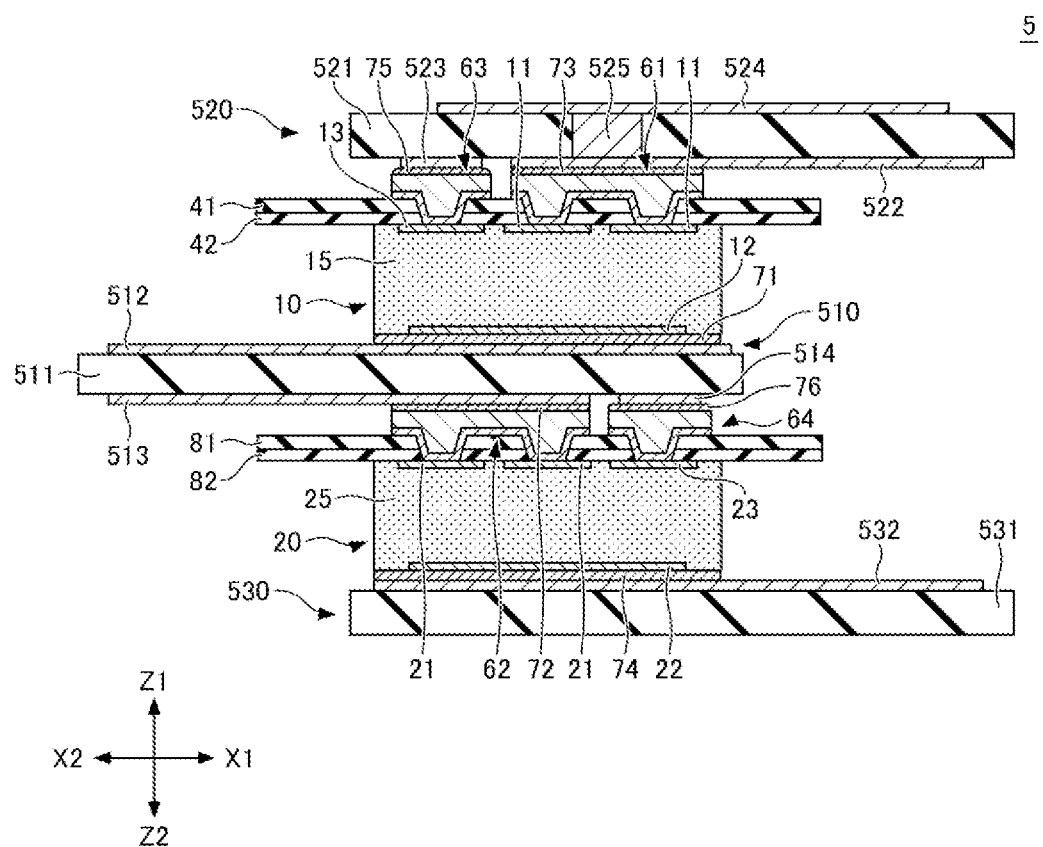
FIG. 9 is a sectional view showing a semiconductor device according to a fifth embodiment.

Next, a fifth embodiment will be described. FIG. 9 is a sectional view showing a semiconductor device according to the fifth embodiment.

As shown in FIG. 9, the semiconductor device 5 according to the fifth embodiment has a wiring substrate 510 in place of the lead terminal 410, the lead terminal 420, the lead terminal 450, and the insulating adhesive layer 470, has a wiring substrate 520 in place of the lead terminals 431 and 440, and has a wiring substrate 530 in place of the lead terminal 432.

The wiring substrate 510 has an insulating layer 511, a wiring layer 512, a wiring layer 513, and a wiring layer 514. The wiring layer 512 is provided on a Z1-side face of the insulating layer 511, and the wiring layers 513 and 514 are provided on a Z2-side face of the insulating layer 511. The material of the insulating layer 511 may be an inorganic material, may be an organic material, or may be a composite material. The wiring layer 512 is fixed to the wiring layers 513 and 514 by the insulating layer 511. Thickness of the insulating layer 511 is in a range of about 50 μm to 2000 μm. The material of the wiring layers 512, 513 and 514 is, for example, copper or a copper alloy. The wiring layer 512 is bonded to an electrode 12 of a semiconductor element 10 by an electrically conductive adhesive layer 71. The wiring layer 513 is bonded to a wiring 62 of a wiring layer 85 by an electrically conductive adhesive layer 72. The wiring layer 514 is bonded to a wiring 64 of the wiring layer 85 by an electrically conductive adhesive layer 76. The wiring layer 512 and the wiring layer 513 face each other in a Z1-Z2 direction through the insulating layer 511, and are electrically connected to each other.

The wiring substrate 520 has an insulating layer 521, a wiring layer 522, a wiring layer 523, a wiring layer 524, and a via conductor 525. The wiring layers 522 and 523 are provided on a Z2-side face of the insulating layer 521, and the wiring layer 524 is provided on a Z1-side face of the insulating layer 521. The via conductor 525 penetrates through the insulating layer 521 to be connected to the wiring layers 522 and 524. The material of the insulating layer 521 may be an inorganic material, may be an organic material, or may be a composite material. The material of the wiring layers 522, 523 and 524 and the material of the via conductor 525 are, for example, copper or a copper alloy. The wiring layer 522 is bonded to a wiring 61 of a wiring layer 45 by an electrically conductive adhesive layer 73, and the wiring layer 523 is bonded to a wiring 63 of the wiring layer 45 by an electrically conductive adhesive layer 75.

The wiring substrate 530 has an insulating layer 531 and a wiring layer 532. The wiring layer 532 is provided on a Z1-side face of the insulating layer 531. The material of the insulating layer 531 may be an inorganic material, may be an organic material, or may be a composite material. The material of the wiring layer 532 is, for example, copper or a copper alloy. The wiring layer 532 is bonded to an electrode 22 of a semiconductor element 20 by an electrically conductive adhesive layer 74.

The wiring substrate 510 includes wiring layers (e.g. the wiring layers 512 and 513) extending toward an X2 side as viewed from the semiconductor elements 10 and 20. Moreover, the wiring substrate 520 includes wiring layers (e.g. the wiring layers 522 and 524) extending toward an X1 side as viewed from the semiconductor elements 10 and 20, and the wiring substrate 530 includes a wiring layer (e.g. the wiring layer 532) extending toward the X1 side as viewed from the semiconductor elements 10 and 20.

In the fifth embodiment, the electrode 12 of the semiconductor element 10 is electrically connected to a P terminal through the wiring layer 512. Electrodes 21 of the semiconductor element 20 are electrically connected to an N terminal through the wiring layer 513. Accordingly, a current flows in the wiring layer 512 in a reverse direction to a direction in which the current flows in the wiring layer 513.

The remaining configuration is the same as or similar to that in the fourth embodiment.

Effects the same as or similar to those in the first embodiment can be also obtained by the fifth embodiment. Specifically, a distance between the wiring layer 512 and the wiring layer 513 is defined by the thickness of the insulating layer 511. Thus, the distance between the wiring layer 512 and the wiring layer 513 becomes sufficiently small so that inductance between the wiring layer 512 and the wiring layer 513 which are parallel reciprocating conducting lines can be reduced. Accordingly, it is possible to provide the semiconductor device 5 that can achieve high-speed switching operation.

Furthermore, according to the fifth embodiment, a distance between the wiring substrate 530 and the wiring substrate 520 is roughly defined by the sum of thickness of the semiconductor element 20, thickness of a flexible wiring substrate 80, thickness of the wiring substrate 510, thickness of the semiconductor element 10, and thickness of a flexible wiring substrate 40. Thus, the distance between the wiring substrate 530 and the wiring substrate 520 becomes sufficiently small so that inductance between the wiring layer 532 and the wiring layer 522 which are parallel reciprocating conducting lines can be reduced.

Sixth Embodiment

Figure 10:
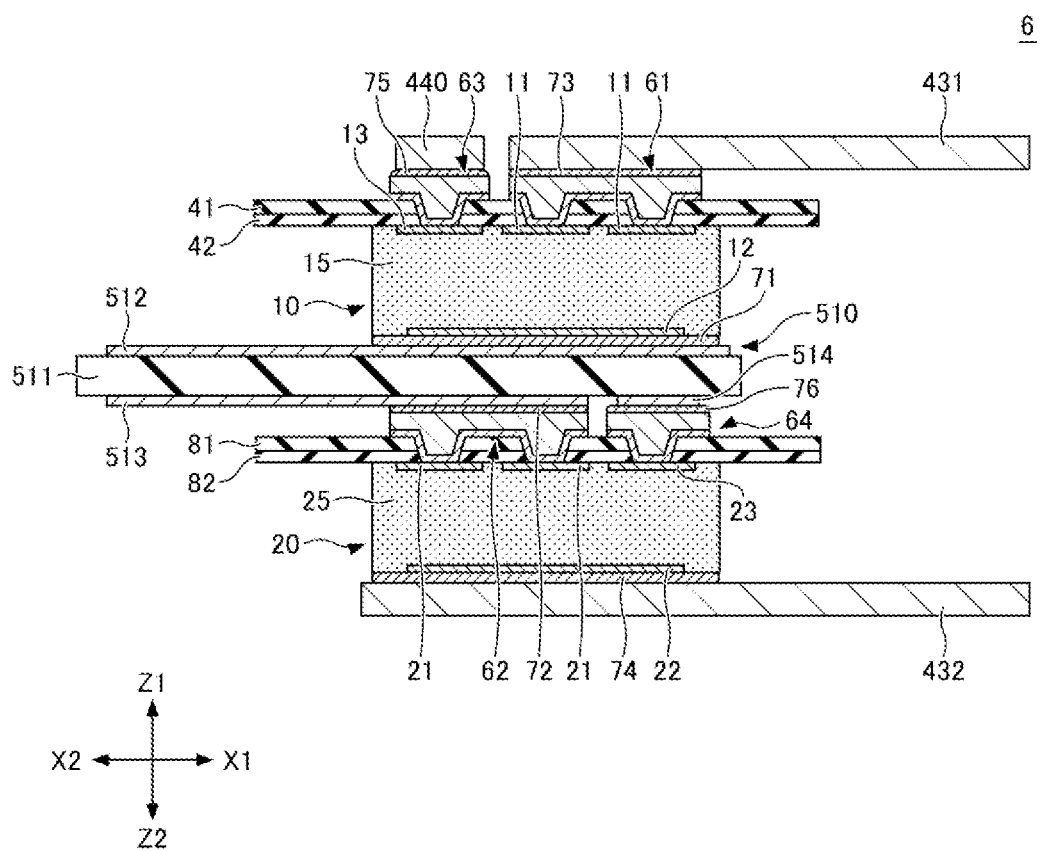
FIG. 10 is a sectional view showing a semiconductor device according to a sixth embodiment.

Next, a sixth embodiment will be described. FIG. 10 is a sectional view showing a semiconductor device according to the sixth embodiment.

As shown in FIG. 10, the semiconductor device 6 according to the sixth embodiment has a wiring substrate 510 in place of the lead terminal 410, the lead terminal 420, the lead terminal 450, and the insulating adhesive layer 470. The wiring substrate 510 has a configuration the same as or similar to that in the fifth embodiment.

The remaining configuration is the same as or similar to that in the fourth embodiment.

Effects the same as or similar to those according to the fourth and fifth embodiments can be also obtained by the sixth embodiment.

Incidentally, the configuration of the wiring substrate is not limited to the aforementioned one, but a ceramic substrate, a build-up substrate, or the like may be used. The wiring substrate is not limited to a single-layer structure, but may be, for example, embodied in a laminate structure in which one or more wiring layers and a plurality of insulating layers are deposited. The wiring layers may be provided in both the front and back faces.

Each of the lead terminals 110, 120, 130, 140, 150, 410, 420, 431, 432, 440 and 450 and the wiring substrates 210, 220, 230, 510, 520 and 530 is an example of a wiring member.

Although the preferred embodiments etc. have been described above in detail, the present disclosure is not limited to the aforementioned embodiments etc., but various modifications and substitutions can be made on the aforementioned embodiments etc. without departing from the scope described in Claims.

What is claimed is:

1. A semiconductor device comprising:
   a first semiconductor element comprising a first face and a second face opposite to the first face, wherein a first electrode is provided in the first face and a second electrode is provided in the second face;
   a second semiconductor element comprising a third face and a fourth face opposite to the third face, wherein a third electrode is provided in the third face and a fourth electrode is provided in the fourth face;
   a first insulating base member comprising a fifth face adhesively bonded to the first face of the first semiconductor element, and a sixth face opposite to the fifth face;
   a first wiring that penetrates through the first insulating base member to be electrically connected to the first electrode, and that is disposed on the sixth face of the first insulating base member;
   a second insulating base member comprising a seventh face adhesively bonded to the third face of the second semiconductor element, and an eighth face opposite to the seventh face;
   a second wiring that penetrates through the second insulating base member to be electrically connected to the third electrode, and that is disposed on the eighth face of the second insulating base member;
   a first wiring member that is electrically connected to the second electrode of the first semiconductor element;
   a second wiring member that faces the sixth face of the first insulating base member, and that is electrically connected to the first wiring and the fourth electrode of the second semiconductor element; and a third wiring member that faces the eighth face of the second insulating base member, and that is electrically connected to the second wiring, wherein:

the first wiring member and the third wiring member face each other, and are electrically connected to each other; and a current flows in a first direction in the first wiring member, and flows in a second direction opposite to the first direction in the third wiring member.

2. The semiconductor device according to claim 1, further comprising:

a first electrically conductive adhesive layer that bonds the first wiring member and the second electrode to each other; and a second electrically conductive adhesive layer that bonds the third wiring member and the second wiring to each other.

3. The semiconductor device according to claim 1, wherein:

the first wiring member has a first lead terminal; and the third wiring member has a second lead terminal.

4. The semiconductor device according to claim 1, wherein:

the first wiring member comprises a first wiring substrate; and the third wiring member comprises a second wiring substrate.

5. The semiconductor device according to claim 1, further comprising:

a third electrically conductive adhesive layer that bonds the second wiring member and the first wiring to each other; and a fourth electrically conductive adhesive layer that bonds the second wiring member and the fourth electrode to each other.

6. The semiconductor device according to claim 1, wherein:

the second wiring member comprises a third lead terminal.

7. The semiconductor device according to claim 1, wherein:

the second wiring member comprises a third wiring substrate.

8. The semiconductor device according to claim 1, wherein:

the first semiconductor element comprises a fifth electrode that is provided in the first face;

the second semiconductor element comprises a sixth electrode that is provided in the third face; and wherein the semiconductor device further comprises:

a third wiring that penetrates through the first insulating base member to be electrically connected to the fifth electrode, and that is disposed on the sixth face of the first insulating base member; and a fourth wiring that penetrates through the second insulating base member to be electrically connected to the sixth electrode, and that is disposed on the eighth face of the second insulating base member.

9. A semiconductor device comprising:

a first semiconductor element comprising a first face and a second face opposite to the first face, wherein a first electrode is provided in the first face and a second electrode is provided in the second face;

a second semiconductor element comprising a third face and a fourth face opposite to the third face, wherein a third electrode is provided in the third face and a fourth electrode is provided in the fourth face;

a first insulating base member comprising a fifth face adhesively bonded to the first face of the first semiconductor element, and a sixth face opposite to the fifth face;

a first wiring that penetrates through the first insulating base member to be electrically connected to the first electrode, and that is disposed on the sixth face of the first insulating base member;

a second insulating base member comprising a seventh face adhesively bonded to the third face of the second semiconductor element, and an eighth face opposite to the seventh face;

a second wiring that penetrates through the second insulating base member to be electrically connected to the third electrode, and that is disposed on the eighth face of the second insulating base member;

a first wiring member that is electrically connected to the second electrode of the first semiconductor element;

a second wiring member that faces the eighth face of the second insulating base member, and that is electrically connected to the second wiring; and an insulating fixation member that is disposed between the first wiring member and the second wiring member, wherein:

the first wiring member and the second wiring member face each other, and are electrically connected to each other; and a current flows in a first direction in the first wiring member, and flows in a second direction opposite to the first direction in the second wiring member.

10. The semiconductor device according to claim 9, further comprising:

a first electrically conductive adhesive layer that bonds the first wiring member and the second electrode to each other; and a second electrically conductive adhesive layer that bonds the second wiring member and the second wiring to each other.

11. The semiconductor device according to claim 9, wherein:

the first wiring member comprises a first lead terminal; and the second wiring member comprises a second lead terminal.

12. The semiconductor device according to claim 11, wherein:

the insulating fixation member comprises an insulating adhesive layer that bonds the first lead terminal and the second lead terminal to each other.

13. The semiconductor device according to claim 9, wherein:

the insulating fixation member comprises an insulating layer that comprises a ninth face facing the second face of the first semiconductor element, and a tenth face opposite to the ninth face;

the first wiring member comprises a first electrically conductive layer that is provided on the ninth face of the insulating layer; and the second wiring member comprises a second electrically conductive layer that is provided on the tenth face of the insulating layer.

14. The semiconductor device according to claim 9, further comprising:

a third wiring member that is electrically connected to the first wiring; and a fourth wiring member that is electrically connected to the fourth electrode.

15. The semiconductor device according to claim 14, further comprising:
   a first electrically conductive adhesive layer that bonds the third wiring member and the first wiring to each other; and
   an second electrically conductive adhesive layer that bonds the fourth wiring member and the fourth electrode to each other.

16. The semiconductor device according to claim 14, wherein:
   the third wiring member comprises a first lead terminal; and
   the fourth wiring member comprises a second lead terminal.

17. The semiconductor device according to claim 14, wherein:
   the third wiring member comprises a first wiring substrate; and
   the fourth wiring member comprises a second wiring substrate.

* * * * *